(12) United States Patent
Jewett et al.

(10) Patent No.: US 6,326,584 B1
(45) Date of Patent: Dec. 4, 2001

(54) METHODS AND APPARATUS FOR RF POWER DELIVERY

(75) Inventors: Russell F. Jewett, Charlotte, NC (US); Curtis C. Camus, Fort Collins, CO (US)

(73) Assignee: Litmas, Inc., Charlotte, NC (US)

( * ) Notice: Subject to any disclaimer, the term of this patent is extended or adjusted under 35 U.S.C. 154(b) by 0 days.

(21) Appl. No.: 09/476,020

(22) Filed: Dec. 31, 1999

(51) Int. Cl.$^7$ .................................................... B23K 10/00
(52) U.S. Cl. .............................. 219/121.57; 219/121.54
(58) Field of Search ..................... 219/121.57, 121.54, 219/139 PS, 130.5, 130.1, 660, 661, 663, 665, 666, 778, 779; 315/111.21, 17.3, 464; 204/298.08, 298.32; 156/345

(56) References Cited

U.S. PATENT DOCUMENTS

| | | | |
|---|---|---|---|
| 5,116,482 | * 5/1992 | Setoyama et al. | 204/298.08 |
| 5,273,610 | * 12/1993 | Thomas, III et al. | 156/345 |
| 5,314,603 | * 5/1994 | Sugiyama et al. | 204/298.32 |
| 5,467,013 | 11/1995 | Williams et al. | 324/127 |
| 5,556,549 | 9/1996 | Patrick et al. | 216/61 |
| 5,643,364 | 7/1997 | Zhao et al. | 118/723 E |
| 5,654,679 | 8/1997 | Maveretic et al. | 333/17.3 |
| 5,688,357 | 11/1997 | Hanawa et al. | 156/445 |
| 5,750,823 | 5/1998 | Wofford et al. | 588/210 |
| 5,770,922 | * 6/1998 | Gerrish et al. | 315/111.21 |
| 5,892,198 | 4/1999 | Barnes et al. | 219/121.54 |
| 5,939,886 | 8/1999 | Turner et al. | 324/464 |

OTHER PUBLICATIONS

Tonnis et al., "Point of Use Plasma Abatement of HFC and PFC Emissions," Northern California AVS Plasma Etch Users Group meeting Feb. 17, 1998.

Liao et al., "Inductive Coupled Plasmas for Point of Use PFC Abatement," Northern California AVS Plasma Etch Users Group meeting Feb. 17, 1998.

Tonnis et al., "Evaluation of a Litmas Blue Point of Use (POU) Plasma Abatement Device for Perfluorocompound (PFC) Destruction," International Sematech Technology Transfer #98123605A–ENG, Dec. 15, 1998.

Vartanian et al., "Long–term Evaluation of Litmas 'Blue' Plasma Device for Point–of–Use POU Perfluorocompound and Hydrofluorocarbon Abatement," International Sematech Technology Transfer #99123865B–ENG, May 3, 2000.

Brochure titled "Committed to Eliminating Perfluorinated Compound Emissions," 1998.

Copy of web pages titled "Litmas High–density Plasma Tools," updated Apr. 27, 1999.

List of search results obtained from USPTO database search.

List of search results obtained from European Patent Office database search.

* cited by examiner

*Primary Examiner*—Teresa Walberg
*Assistant Examiner*—Quang Van
(74) *Attorney, Agent, or Firm*—Larry Williams

(57) ABSTRACT

RF power is delivered to a load in an RF power processor for carrying out process operations. The RF power delivery is performed using a variable frequency RF power amplifier and a control system. The control system maintains RF power delivery using control signals derived from reference RF signals used by the RF power amplifier and measurements of a characteristic of the RF power. The magnitude of the delivered RF power is controlled using measurements of the power input to the RF power amplifier.

35 Claims, 3 Drawing Sheets

METHODS AND APPARATUS FOR RF POWER DELIVERY

BACKGROUND

The present invention relates to improved methods and apparatus for delivering radio frequency (RF) power for RF power process operations.

RF power is used in a wide variety of applications for carrying out process operations. Exemplary of such process operations is the use of RF induction power for heating. RF induction heating involves coupling RF power to a material, such as a workpiece, that absorbs the RF power and converts the RF power into heat. In other words, the currents induced in material by the RF power are converted into heat because of the electrical resistance of the material that absorbs the RF power. In this manner, the RF power can be used to heat the workpiece without having physical contact between the power source and the object. This type of heating can be used when the workpiece is the material that absorbs the RF power, and the workpiece is heated directly by the RF power. Alternatively, the workpiece may be in contact with or near a second material that absorbs RF power. The second material absorbs the RF power and creates heat. The heat is then transferred to the workpiece by conduction, convection, or radiation.

In another example of RF heating, the RF power can be coupled to a gas to produce a thermal plasma. Free electrons in the thermal plasma absorb the RF power and they are raised to high energy levels. These energetic free electrons interact with other gas phase species to produce a high temperature mixture capable of transferring thermal energy to other gases, liquids, or solids.

The thermal plasmas mentioned above can be used to promote chemical reactions. Chemical reactions can be promoted because of the high temperatures of the thermal plasma. Alternatively, thermal plasmas are able to promote chemical reactions because of the ability of the energetic electrons to break chemical bonds and allow chemical reactions to occur that would proceed with difficulty under non-plasma conditions.

The manufacture of optical fiber pre-forms is an example of the use of thermal plasmas generated using RF power. The RF thermal plasma provides the energy for driving the chemical reactions in gas mixtures of silicon compounds, oxygen, and dopants. The chemical reactions cause deposition of doped silica layers.

Another example involving RF power thermal plasmas is the operation of high-pressure gas lasers. In gas laser operation, the important characteristic of the RF plasma is the light emission that occurs because of the plasma. The thermal energy that is produced is generally not considered important to the operation of the laser.

In other applications, RF power is used to produce non-thermal plasmas, also referred to as non-equilibrium plasmas. The fabrication of semiconductor devices is one area in which non-thermal plasmas are extensively used. The non-thermal plasmas are used for etch processes wherein the non-thermal plasmas are used to generate reactive species in a gas to accelerate reactions between the species and a solid surface. The etch process can be a general removal of components on the surface as in a cleaning process or the selective removal of material from certain areas on the surface through use of a masking material that has been previously patterned. Non-thermal plasmas are used to promote deposition reactions wherein gas phase species are caused to react to form a solid product that deposits on surfaces. During the manufacture of semiconductor devices, etch processes involving RF plasmas and deposition processes involving RF plasmas are used repeatedly during the fabrication process. One of the main benefits of using the non-thermal plasma is the ability of the non-thermal plasma to stimulate chemical reactions that would otherwise require temperatures that are too high for use in the fabrication of semiconductor devices.

RF power non-thermal plasmas are also used as cleaning processes in the fabrication of semiconductor devices. The non-thermal plasmas are commonly used to strip photoresist materials from semiconductor wafers as part of post etch wafer clean procedures. The photoresist material serves as a mask material during etch processes used in patterning the surface of the devices. Resist material is stripped from the surface of the wafers by creating a non-thermal plasma in a gas containing oxidizing species such as oxygen and possibly halogen species that are capable of reacting with and volatilizing the resist material. In some applications, the non-thermal plasma is maintained at a position upstream of the wafer. Reactive species generated in the non-thermal plasma flow downstream and react with the wafer surface for the stripping process.

Another cleaning process that uses non-thermal plasmas is the cleaning of reaction chambers used in semiconductor manufacturing. Sometimes, the reaction chambers used in plasma etch processes experience a buildup of deposits from the etch process. These deposits need to be removed as part of the reactor maintenance process. In addition, the reactors that are used in deposition processes for semiconductor device fabrication undergo a buildup of deposits on the reactor walls; the wall deposit must be removed as part of reactor maintenance. Non-thermal plasmas generated using RF power and gases containing species that are reactive with the deposits have been used to volatilize and removed the deposits built up on the walls of etch reactors and deposition reactors.

RF power plasmas have also been used for decomposition of chemical compounds that are hazardous or otherwise undesirable. Some of the compounds are highly refractory in nature and are difficult to decompose. Examples of compounds that have been decomposed or abated with plasmas include chlorofluorocarbons (CFC) and perfluorocompounds (PFC).

The applications given above where RF power is used as part of a process makeup only a small fraction of the applications for RF power. There are numerous additional processing applications for RF power. However, the methods and apparatus typically used to deliver RF power have deficiencies and may be inefficient for use in some RF power process operations. Some of the deficiencies are common for multiple applications. The existing deficiencies in the prior methods and apparatus for RF power delivery may limit the use of RF power for possible new applications.

One frequently encountered problem with prior RF power delivery systems is that the equipment tends to be large and heavy. There are instances in which the size of the RF power generator greatly exceeds the size of the processing chamber. Problems resulting from the large size of the equipment include taking up excess space on a factory floor. The excess space required by the equipment can be quite expensive if it is in a high-cost factory, such as a cleanroom used in semiconductor manufacturing. The large size also makes transporting the equipment difficult. Moving the apparatus frequently requires more than one person and the use of moving equipment.

A second problem with existing RF power delivery systems is their complexity. The existing systems frequently have redundant systems and extra capabilities that are unnecessary. In addition, the effort to derive data for controlling the RF power delivery is unnecessarily complex.

Here is one example of how a typical old-style RF power delivery system operates. Low frequency AC power is rectified and then switched to provide current to the RF amplifier. The RF amplifier drives current through an output match network and then through an RF power measurement circuit to the output of the power supply. The output match is usually designed to provide RF power that matches an impedance of 50 ohms. The 50 ohm impedance match is necessary in order to have the same characteristic impedance as the industry standard coaxial cables. Power flow through the 50 ohm coaxial cable section is measured again by a load match controller. The instrument used for measuring the power is also designed to be compatible with the 50 ohm impedance of the coaxial cable. A load match, usually a variable RF match with a motorized automatic tuner, transforms the RF power again to enable the RF power to be coupled to a load. Motors in the tuner can change the values of variable capacitors and inductors present in the tuner. The variable load match is necessary in order to accommodate changes in the impedance of the load. Specifically, the variable load match makes it possible for the RF amplifier to provide RF power at a constant impedance to a load that may have a variable impedance. This arrangement allows constant RF power delivery if the load impedance changes.

In the example just presented, the RF power is measured multiple times at different points between the RF amplifier and the load. In addition, special coaxial cable and measuring instruments are necessary in order to comply with the industry standards. Furthermore, the RF power measurements typically include forward RF power measurements and reflected RF power measurements.

The coaxial cables described in the previous example present an additional problem for high frequency RF power. The length of the coaxial cable may be long enough, with respect to the wavelength of the RF power, to allow standing wave formation from the forward RF power and reflected RF power. Standing waves in the coaxial cable produce high peak currents and voltages that can damage the coaxial cable.

For low frequency RF power delivery systems, the operation may be different from that of the previous example. The low frequency RF power delivery systems use a low frequency RF power amplifier. The low frequency RF amplifier is coupled through a fixed load match to a load. Because the RF frequency is low, the transmission line between the RF amplifier and the load generally is much shorter than a quarter wavelength, so that no standing wave pattern occurs in the coaxial cable. Consequently, there are no problems with high peak voltages and peak currents for low frequency RF power delivery systems.

In the typical old-style RF power delivery systems, whether low frequency or high frequency, forward RF power and reflected RF power are both measured. Usually the forward and reflected RF power measurements are made with a device such as a dual directional coupler. The forward and reflected power measurements are used as part of the RF power control system to maintain a constant power delivery to the load. Measurements of the reflected RF power is used in high frequency RF power delivery systems to control the variable load match such that match conditions are obtained that give a substantially zero reflected power. In low frequency RF power systems, the reflected power measurements are used to adjust the forward RF power to obtain the desired net RF power delivery to the load.

Clearly, there are numerous applications requiring RF power delivery systems. Unfortunately, typical methods and apparatus for old-style RF power delivery systems have characteristics that may be undesirable for some applications. There is a need for RF power delivery methods and apparatus that are simple in operation, use a minimum number of parts, minimize redundancy, and provide high reliability.

SUMMARY

This invention seeks to provide methods and apparatus that can overcome the deficiencies of known RF power delivery systems. Practicing this invention makes it possible to achieve RF power delivery to a load with lower complexity and fewer parts than are typically required in known RF power delivery systems.

Aspects of the present invention are accomplished using a simpler system for controlling the RF power delivery to a load. One aspect of the invention is the control of RF power delivery by measuring a characteristic of the output RF power at an RF power coupling element and comparing the measured characteristic to a reference RF signal (a small RF signal) used by a variable frequency RF power amplifier and adjusting the frequency of the reference RF signal to maintain a constant phase angle between the reference RF signal and the measured signal for the RF power characteristic at the RF power coupling element.

Another aspect of the invention is a method for controlling an apparatus for delivering RF power to the load. The method is performed with an RF power coupling element, and a variable frequency RF power amplifier capable of delivering RF power to the load via the RF power coupling element. The method includes deriving a control signal by comparing a characteristic of the RF power at the RF power coupling element to a characteristic of a reference RF signal used by the RF power amplifier. The method also includes using the control signal to adjust the frequency of the reference RF signal used by the RF power amplifier so as to effect efficient RF power delivery to the load.

It is a further aspect of the present invention to achieve efficient RF power delivery based on a particular attribute of the RF power. For example, the delivery of RF power can be controlled to maintain a constant magnitude of the RF power. Alternatively, the delivery of RF power can be controlled to maintain a constant magnitude of the RF current. Alternatively, the delivery of RF power can be controlled to maintain a constant magnitude of the RF voltage. Preferably, efficient RF power delivery is based on the magnitude of the RF power.

In another aspect of the present invention, power output from an RF amplifier is applied directly to an RF match without the use of coaxial cables. A variable RF match can be used in embodiments of the present invention. However, the preferred embodiment is to use a fixed RF match. The fixed RF match contains a match network having capacitance and inductance values that approximate tuned conditions expected for the load. An RF power coupling element is connected directly with the output of the fixed RF match; this connection is also made without the use of coaxial cables. The power coupling element couples RF power to a load. A sensor measures phase information for a characteristic of the RF power in the RF power coupling element. Two examples of the characteristics of the RF power in the RF power coupling element that can be used are RF current and RF voltage. A controller receives the measured phase information and determines the phase angle between the characteristic of the RF power in the RF power coupling element and a reference RF signal used by the RF power amplifier. The controller drives the phase angle between the reference RF signal and the characteristic of RF power in the coil to a predetermined constant phase angle by adjusting the frequency of the reference RF signal used by the RF power amplifier. The adjustments to the frequency of the RF power amplifier reference RF signal also appear as changes in the frequency of the RF power output from the amplifier. Maintaining the predetermined constant phase angle between the characteristic of RF power in the RF power coupling element and the reference RF signal used by the RF power amplifier causes the efficiency of RF power delivery to the load to be substantially unchanged by changes in the load impedance. The correlation between the phase of the reference RF signal used by the RF power amplifier and the phase of the RF current in the RF power coupling element replaces the need to measure the reflected RF power. Consequently, the circuitry required for measuring reflected RF power and for measuring forward RF power becomes unnecessary for achieving efficient RF power delivery for embodiments of the present invention.

In another aspect of the present invention, RF power can be delivered at a controlled magnitude of the RF power. In one embodiment, a meter measures the power input to an RF amplifier. The power input to the RF amplifier can be DC power from a DC power source, or DC power derived from an AC power source, or AC power from a sub-radio frequency AC power source such as a slow AC power source. The RF amplifier uses the input power to produce an output of RF power. Power output from the RF amplifier is applied directly to a fixed RF match without the use of coaxial cables. The fixed RF match contains a match network having capacitance and inductance values that approximate tuned conditions expected for the load. An RF power coupling element is connected directly to the output of the fixed RF match. As one embodiment, this connection can be made without the use of coaxial cables. The RF power coupling element couples RF power to the load. A sensor measures the phase information for a characteristic of the RF power in the RF power coupling element. Examples of the characteristic of the RF power that can be used include RF current and RF voltage. A controller receives the measured phase information and determines the phase angle between the characteristic of the RF power in the RF power coupling element and a reference voltage used by the RF power amplifier. The controller controls the phase angle to a constant value by adjusting the frequency of the reference RF signal used by the RF power amplifier. The adjustments to the frequency of the RF power amplifier reference RF signal also appear as changes in the frequency of the RF power output from the amplifier. Maintaining the constant phase angle between the characteristic of the RF power in the RF power coupling element and the reference RF signal used by the RF power amplifier causes the efficiency of RF power delivery to the load to be substantially unchanged by changes in the load impedance. A power controller is used to control the magnitude of the RF power delivered to the load. The power meter provides to the power controller a signal of the measured power input to the RF amplifier. The power controller also receives set point information for the desired RF power. A control system in the power controller determines an output signal based on the set point information and the measured input power to the RF amplifier. The output signal from the power controlled is a gain signal for adjusting the gain of the RF amplifier. The control system in the power controller adjusts the gain of the RF amplifier until the power input to the RF amplifier substantially equals the set point power. Controlling the input power to the RF amplifier at the set point for the power controller provides control of the magnitude of the RF power delivered to the load. The magnitude of the RF power is determined from the measured input power to the RF amplifier and the known RF power conversion efficiency for the RF amplifier.

Another aspect of the present invention is a method or RF power delivery in which the RF power delivery efficiency is directly maximized using a sensor and a controller to maintain a predetermined constant phase angle between a characteristic of the RF power in an RF power coupling element and a reference RF signal used by an RF power amplifier. In one embodiment, the controller receives an input signal from the sensor that provides information about the phase of the characteristic of the RF power in the RF power coupling element. The controller outputs a signal to the RF amplifier adjusting the frequency of the reference RF signal used by the RF amplifier so that the frequency of the output RF power varies. The adjustments to the reference RF signal used by the RF amplifier to maintain the constant phase angle between the characteristic of the RF power in the RF power coupling element and the reference RF signal used by the RF amplifier results in efficient RF power delivery to the load. The RF power delivery is controlled electronically without moving parts by varying the frequency of the reference RF signal supplied to the RF power amplifier.

In accordance with a further aspect of the present invention, the RF power delivery is also controlled so that a set magnitude of power is delivered to the load. In one embodiment of the present invention, the magnitude of the RF power is determined from the measured input power to the RF amplifier and the known RF power conversion efficiency for the RF amplifier. A power controller is used to control the magnitude of the RF power delivered to the load. The power meter provides to the power controller a signal of the measured power input to the RF amplifier. The power controller also receives set point information for the desired RF power. A control system in the power controller determines an output signal based on the set point information and the measured input power to the RF amplifier. The output signal from the power controller is a gain signal for adjusting the gain of the RF amplifier. The control system in the power controller adjusts the gain of the RF amplifier until the power input to the RF amplifier substantially equals the set point power. Controlling the input power to the RF amplifier at the set point for the power controller provides control of the magnitude of the RF power delivered to the load to a predetermined magnitude. The RF power magnitude can be calculated using the measured input power to the RF power amplifier and the known power conversion efficiency for the RF power amplifier.

In one embodiment of the present invention, control of the reference RF signal to achieve efficient RF power delivery is simultaneous with the control of the magnitude of the RF power output from the RF amplifier. In another embodiment, the RF power magnitude is controlled after efficient RF power delivery is achieved through control of the reference RF signal.

In accordance with another aspect of the invention, a load is matched to an RF power source that supplies sufficient RF power to perform a process step. The method uses a variable frequency RF power amplifier that delivers RF power to the load via a fixed RF match and RF power coupling element. The method comprises adjusting the frequency of a reference RF signal used by the RF amplifier to maintain a predetermined constant phase angle between the characteristic of the RF power through the RF power coupling element and a reference RF signal used by the RF amplifier to achieve a resonant frequency for coupling RF power to the load. The method further comprises measuring power input to the RF amplifier and providing a gain signal to the RF amplifier as a function of the measured input power and a set point power. Using the gain signal, the output RF power for the amplifier is adjusted to deliver RF power to the load at a controlled magnitude. The magnitude of the RF power is derived from the measured power input to the RF amplifier and the known power conversion efficiency of the RF power amplifier.

Another aspect of the invention relates to the combination including an RF power processor for receiving RF power and using the RF power to carry out a process; a power coupling element for coupling RF power to the RF power processor; a fixed RF match connected to the RF power coupling element for matching the RF power to the RF power processor; a variable frequency RF amplifier connected to the match for providing RF power for delivery to the RF power processor; a sensor for determining phase information for the characteristic of the RF power in the power coupling element, the sensor providing a first output signal related to the phase information for the characteristic of the RF power in the RF coupling element; and a first controller responsive to the first output signal from the sensor, the first controller controlling the frequency of a reference RF signal used by the RF power amplifier to maintain a predetermined constant phase angle between the characteristic of the RF power in the RF power coupling element and the reference RF signal used by the RF power amplifier. The combination further comprising a meter for measuring power input to the RF amplifier, the meter having a third output signal related to the measured power input to the RF amplifier; and a second controller responsive to the third output signal from the meter and a power set point for controlling the gain of the RF amplifier to allow a controlled magnitude of RF power delivery to the RF power processor.

In one embodiment, the first controller includes a phase locked loop responsive to the output signal from the sensor. The first controller then generates the second output signal that adjusts the frequency of the reference RF signal used as an input to the RF power amplifier. Adjustments are made to the frequency of the reference RF signal used by the RF power amplifier so as to maintain a constant phase angle between the phase of the characteristic of the RF power in the RF power coupling element and the phase of the reference RF signal provided to the RF amplifier.

In the aspects of the present invention, embodiments of the RF power coupling element can have any form suitable for RF power delivery. Exemplary forms of RF power coupling elements are antennas, coils, cylindrical coils, planar coils, electrodes, rings, parallel plates, screens, and waveguides. Various types of RF power coupling elements are well known in the art.

In various separate embodiments of the present invention, the load that receives the RF power may use the RF power for different applications. Exemplary functions of the loads for various applications are as follows. The load may absorb the RF power to produce heat for a heating process as in RF induction heating. The load may absorb the RF power to produce a thermal plasma such as those used for chemical processing, materials processing, analytical chemistry, or driving optical devices. The load may absorb the RF power to produce a non-thermal plasma such as those used for chemical processing or materials processing. The load may absorb RF power to produce non-thermal plasmas such as plasmas used for semiconductor device fabrication processes like etching, deposition, cleaning, doping, oxidation, drying, photoresist stripping, parts cleaning, reaction chamber cleaning, and annealing. The load may absorb RF power to produce a plasma for stimulating chemical reactions that cannot proceed or proceed slowly under non-plasma conditions. The load may absorb RF power to produce a plasma for decomposing chemical compounds. The load may absorb RF power to produce a plasma for synthesizing chemical compounds.

In another aspect of the present invention, the delivered RF power can be used for the abatement of gaseous halogenated organic compounds, other refractory organic compounds, perfluorocompounds, and refractory inorganic compounds. The apparatus includes a non-thermal plasma generated by RF power as the means for generating free radicals in a dielectric reaction vessel. In a further aspect of the present invention, the treatment of gases can be enhanced by the addition of suitable ancillary reaction gases including water, methane, hydrogen, ammonia, hydrogen peroxide, oxygen, or mixtures thereof.

One object of embodiments of the present invention is to provide methods and apparatus for RF power delivery without the need for excess equipment and complexity. The object is to achieve effective RF power delivery without dependence on moving parts, with minimum redundancy of parts, and with minimum repetition of measurements.

Another object of embodiments of the present invention is to provide methods and apparatus for RF power delivery that allow the delivery of RF power using equipment that is small and lightweight with respect to traditional RF power delivery equipment. The object is to have equipment for some applications they can be handled by one-person and that takes up a minimum of space in a factory or semiconductor fab.

Another object of embodiments of the present invention is to provide methods and apparatus for RF power delivery for heating as in RF induction heating.

Another object of embodiments of the present invention is to provide methods and apparatus for RF power delivery for generation of plasmas.

Another object of embodiments of the present invention is to provide methods and apparatus for RF power delivery for generation of thermal plasmas.

Another object of embodiments of the present invention is to provide methods and apparatus for RF power delivery for generation of non-thermal plasmas.

Another object of embodiments the present invention is to provide methods and apparatus for power delivery for promoting chemical reactions.

Another object of embodiments of the present invention is to provide methods and apparatus for RF power delivery for generation of plasmas for semiconductor device fabrication steps such as etching, deposition, cleaning, doping, oxidation, drying, photoresist stripping, parts cleaning, reaction chamber cleaning, and annealing.

Another object of embodiments of the present invention is to provide methods and apparatus for removal of refractory compounds from waste streams. Refractory compounds include compounds that show a high degree of stability with respect to temperature and reactivity and are difficult to decompose.

Another object of embodiments of the present invention is to provide new and useful methods and apparatus for the destruction of refractory compounds such as perfluorocompounds, such as carbon fluorides, carbon tetrafluoride, nitrogen triflouride, and sulfur hexafluoride by reactions facilitated by a plasma.

Yet, another object of embodiments of the present invention is to provide methods and apparatus for gas waste treatment using a non-thermal plasma generated by RF power.

A further object of embodiments of the present invention is to provide methods and apparatus that are suitable for processing waste streams emanating from an individual semiconductor process tool and that can become an integral part of the semiconductor device fabrication process.

An advantage of embodiments of the present invention is the ability to provide an economical apparatus and method for the destruction of refractory compounds contained in gaseous waste streams.

Another advantage of embodiments of the present invention is the ability to provide waste treatment of undiluted off gases from individual semiconductor device fabrication tools. Embodiments of the present invention can be made compact enough to be integrated into and attached directly to one or more than one wafer processing tools.

The above and still further objects, features and advantages of the present invention will become apparent upon consideration of the following detailed descriptions of specific embodiments thereof, especially when taken in conjunction with the accompanying drawings.

DESCRIPTION

Figure 1:
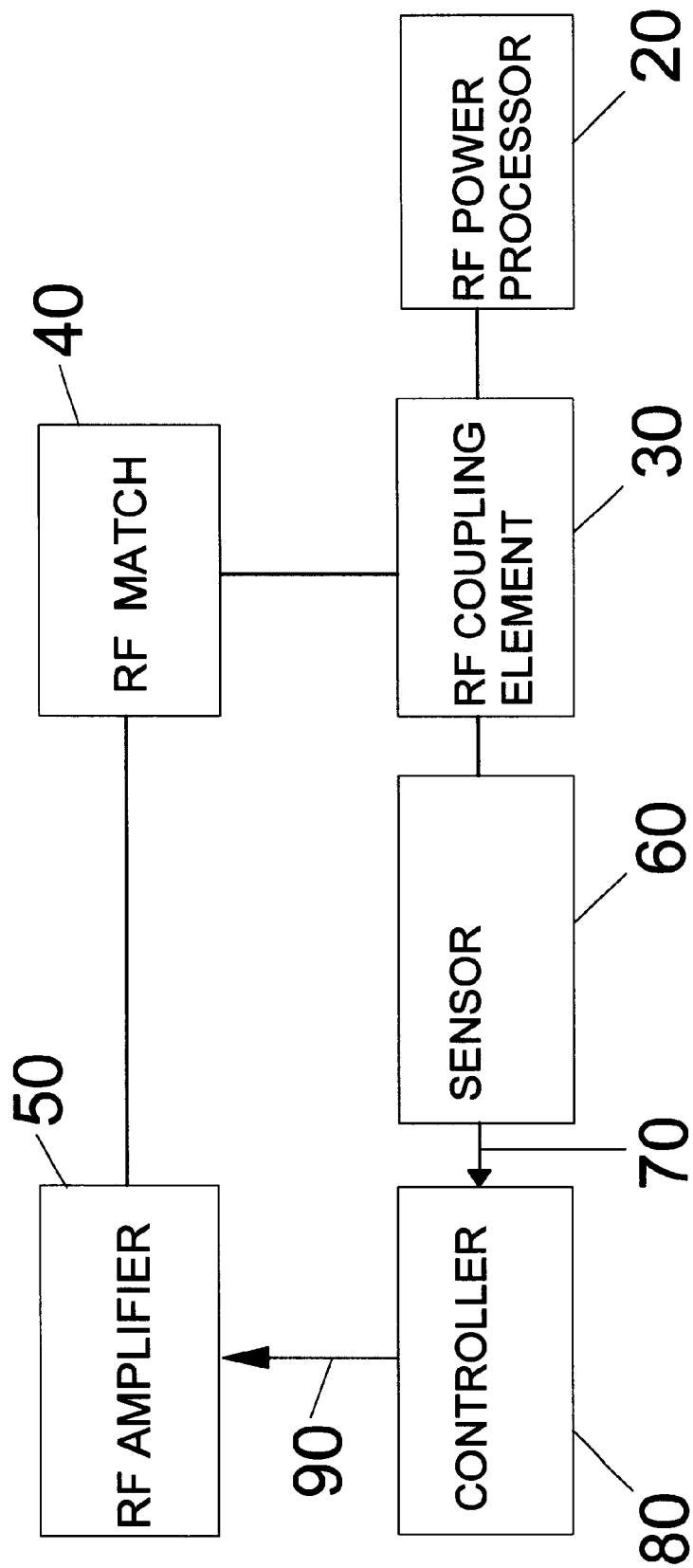
FIG. 1 is a schematic block diagram of a first embodiment of the present invention.

Reference is now made to FIG. 1 wherein there is illustrated an RF power processor 20 such as a plasma chamber, a vacuum processing plasma chamber, a plasma reactor, or an RF induction heater. The RF power processor 20 typically operates with a load capable of absorbing RF power and using the RF power for a process operation. Typical RF power operations and the characteristics of appropriate loads are well known in the art. An RF power coupling element 30 is disposed so as to inductively couple RF power to the RF power processor 20. An RF match 40 is connected with the RF power coupling element 30. A variable frequency RF power amplifier 50 is connected with the RF match 40 so that RF power output from the variable frequency RF power amplifier 50 can be applied to the RF power coupling element 30 via the RF match 40. The variable frequency RF power amplifier 50 is a standard RF power amplifier that uses a reference RF signal and input electric power so that it is capable of providing a relatively high output RF power. Examples of two types of reference RF signals are RF current and RF voltage. A sensor 60 is located near the RF power coupling element 30. The sensor 60 is arranged so as to be capable of deriving information for one or more of the oscillating characteristics of RF power in the RF power coupling element 30. An example of the information derived by the sensor 60 includes phase information; another example is frequency information. The sensor 60 is also capable of providing a first output signal 70 related to the information representative of the characteristics of RF power in the RF power coupling element 30. A first controller 80 receives the first output signal 70 from the sensor 60. The first controller 80 maintains a constant phase angle between the first output signal 70 and the reference RF signal used by the RF power amplifier 50. The first controller 80 maintains the constant phase angle by adjusting the frequency of the reference RF signal used by the RF power amplifier 50. The first controller 80 provides the reference RF signal information as a second output signal 90 to the RF power amplifier 50. The RF power amplifier 50 uses the second output signal 90 and electric power input to produce the RF power applied to the RF match 40.

Preferably, the constant phase angle used by the first controller 80 is a predetermined constant incorporate in the first controller 80 as a control parameter. Various commercially available controllers can be used for the first controller 80. Typical controllers that can be selected for the first controller 80 use a phase locked loop. A phase locked loop is a control system that uses feedback to maintain an output signal in a specific phase relationship with a signal supplied to the phase locked loop. When a phase locked loop is selected to provide the control for the first controller 80, the phase locked loop maintains a constant phase angle between the reference RF signal used by the RF power amplifier 50 and the first output signal 70.

Techniques for incorporating the constant phase angle into the first controller 80 are well known to those skilled in the art. It is typical for controllers suitable for use as the first controller 80 to allow setting the control parameters such as phase angles. The constant phase angle is derived incorporated as part of pre-tuning the controller. An example procedure for pre-tuning the controller includes: using the controller to control RF power delivery to a representative load such as a load similar to the load that the controller will be expected to handle; monitoring a parameter of the RF power delivery indicative of the RF power delivery efficiency; varying the control parameters of the controller, such as the phase angle, so as to tune the RF power delivery to achieve desired, preferably optimum, power delivery conditions; fixing the control parameter settings for the controller so that in subsequent use the controller is capable of controlling using the predetermined control parameters such as the predetermined phase angle. In other words, the controller is set with the predetermined control parameters including the predetermined constant phase angle.

Consequently, the embodiment of the present invention shown in FIG. 1 is capable of maintaining the predetermined constant phase angle between the reference RF signal used by the RF power amplifier 50 and the characteristic of the RF power in the RF power coupling element 30 so as to effect desired, preferably efficient, RF power delivery to the load.

Figure 2:
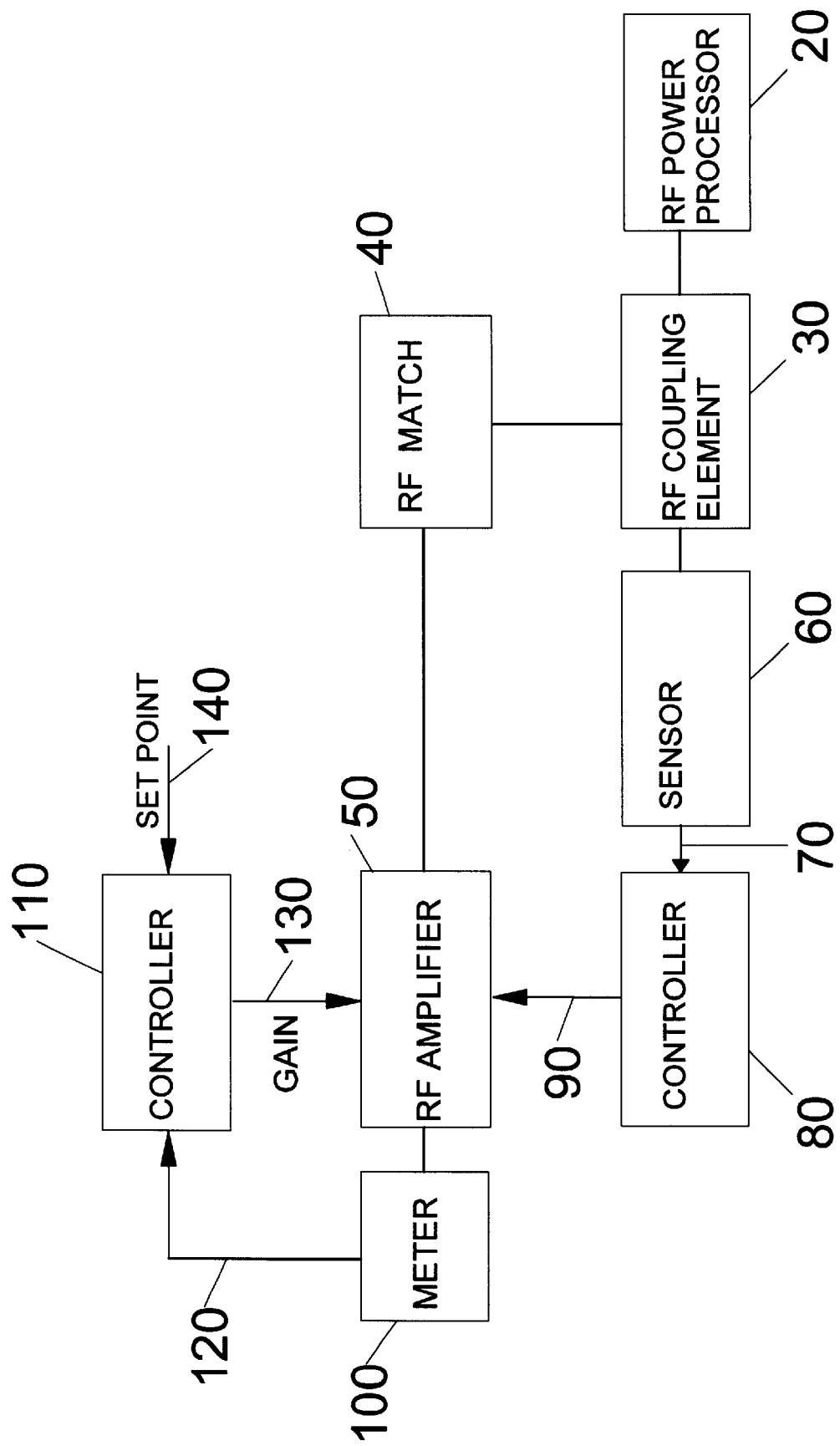
FIG. 2 is a schematic block diagram of a second embodiment of the present invention.

Reference is now made to FIG. 2 of the drawings wherein there is illustrated the RF power processor 20. The RF power processor 20 typically operates with a load capable of absorbing RF power and using the RF power for a process operation. An RF power coupling element 30 is disposed so as to inductively couple RF power to the RF power processor 20. An RF match 40 is connected with the RF power coupling element 30. A variable frequency RF power amplifier 50 is connected with the RF match 40 so that RF power output from the variable frequency RF power amplifier 50 can be applied to the RF power coupling element 30 via the RF match 40. The variable frequency RF power amplifier 50 is a standard RF power amplifier that uses a reference RF signal and input electric power so that it is capable of providing a relatively high output RF power. Examples of two types of reference RF signals are RF current and RF voltage. A sensor 60 is located near the RF power coupling element 30. The sensor 60 is arranged so as to be capable of deriving phase information representative of one or more of the oscillating characteristics of RF power in the RF power coupling element 30. An example of the information derived by the sensor 60 includes phase information; another example is frequency information. The sensor 60 is also capable of providing a first output signal 70 related to the information representative of the characteristics of RF power in the RF power coupling element 30. A first controller 80 receives the first output signal 70 from the sensor 60. The first controller 80 maintains a constant phase angle between the first output signal 70 and the reference RF signal used by the RF power amplifier 50. The first controller 80 maintains the constant phase angle by adjusting the frequency of the reference RF signal used by the RF power amplifier 50.

The first controller 80 provides the reference RF signal information as a second output signal 90 to the RF power amplifier 50. The RF power amplifier 50 uses the second output signal 90 and electric power input to produce the RF power applied to the RF match 40.

FIG. 2 also illustrates a meter 100. The meter 100 is coupled with the RF power amplifier 50 to enable the meter 100 to make measurements on the input electric power provided to the RF power amplifier 50. The meter is capable of measuring one or more characteristics of the electric power provided to the RF power amplifier 50. Typically, the electric power provided to the RF amplifier is either DC or slow AC power such as AC frequencies less than about 600 Hz. Examples of the characteristics of the electric power that the meter 100 may be capable of measuring include input power magnitude, input power voltage, and input power current. The meter 100 produces a third control signal 120 containing information from the power measurements by the meter 100. A second controller 110 is used to control the magnitude of a characteristic of the RF power delivered to the load. The power meter 100 provides to the second controller 110 the third control signal 120 containing information from the power measurements by the meter 100. The second controller 110 also receives set point information 140 for the desired magnitude of the characteristics for the RF power. The second controller 110 derives an output signal as a gain signal 130 for controlling magnitude of the RF power delivered to the load. The gain signal 130 is based on the set point information 140 and the third control signal 120. The gain signal 130 from the second controller 110 is input to the RF power amplifier 50 for adjusting the gain of the RF power amplifier 50. The second controller 110 adjusts the gain of the RF power amplifier 50 to maintain the power input to the RF power amplifier 50 at a value that substantially equals the power specified by the set point information 140. Controlling the input power to the RF power amplifier 50 to the set point information 140 for the second controller 110 provides control of the magnitude of the RF power delivered to the RF power processor 20 to a predetermined magnitude.

The magnitude of the RF power can be derived from measurements of the input power to the RF power amplifier 50 by the meter 100 and the known conversion efficiency of the RF power amplifier 50. The conversion efficiency for the RF amplifier can be measured experimentally as in performing a calibration. Alternatively, the conversion efficiency for the RF amplifier may be obtained from the manufacturer of the RF amplifier. Deriving the RF power magnitude from measurements of the input DC/slow AC power and the RF amplifier conversion efficiency eliminates the need for measuring the RF power output from the amplifier 50. In other words, there is no need to measure the relatively high RF power. Consequently, there is no need for RF power measuring components or circuits for the embodiments of the present invention.

Preferably, the constant phase angle used by the first controller 80 is a predetermined constant incorporate in the first controller 80 as a control parameter. Various commercially available controllers can be used for the first controller 80. Typical controllers that can be selected for the first controller 80 use a phase locked loop. A phase locked loop is a control system that uses feedback to maintain an output signal in a specific phase relationship with a signal supplied to the phase locked loop. When a phase locked loop is selected to provide the control for the first controller 80, the phase locked loop maintains a constant phase angle between the reference RF signal used by the RF power amplifier 50 and the first output signal 70. Techniques for incorporating the constant phase angle into the first controller 80 are well known to those skilled in the art. The example procedure for obtaining the preferred constant phase angle presented for the embodiment shown in FIG. 1 also applies to the embodiment shown in FIG. 2.

Consequently, the embodiment of the present invention shown in FIG. 2 is capable of maintaining the predetermined constant phase angle between the reference RF signal used by the RF power amplifier 50 and the characteristic of the RF power in the RF power coupling element 30 so as to effect desired, preferably efficient, RF power delivery to the load at the controlled magnitude of the characteristic of the RF power determined by the set point. Examples of characteristics of the RF power for which the magnitude can be controlled in performing the RF power delivery include magnitude of the RF power, magnitude of the RF current, and magnitude of the RF voltage.

Figure 3:
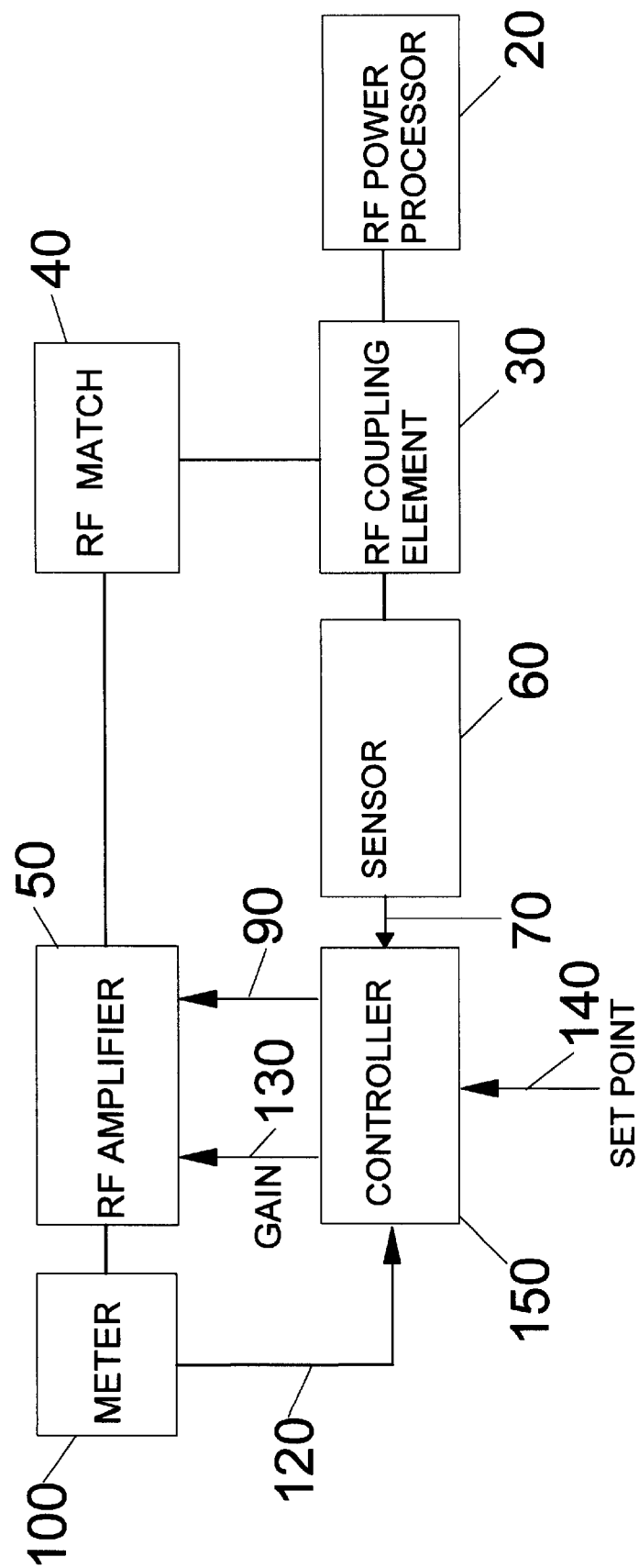
FIG. 3 is a schematic block diagram of a third embodiment of the present invention.

Reference is now made to FIG. 3 of the drawings wherein there is illustrated the RF power processor 20. The RF power processor 20 typically operates with a load capable of absorbing RF power and using the RF power for a process operation. An RF power coupling element 30 is disposed so as to inductively couple RF power to the RF power processor 20. An RF match 40 is connected with the RF power coupling element 30. A variable frequency RF power amplifier 50 is connected with the RF match 40 so that RF power output from the variable frequency RF power amplifier 50 can be applied to the RF power coupling element 30 via the RF match 40. The variable frequency RF power amplifier 50 is a standard RF power amplifier that uses a reference RF signal and input electric power so that it is capable of providing a relatively high output RF power. Examples of two types of reference RF signals are RF current and RF voltage. A sensor 60 is located near the RF power coupling element 30. The sensor 60 is arranged so as to be capable of deriving phase information representative of one or more of the oscillating characteristics of RF power in the RF power coupling element 30. An example of the information derived by the sensor 60 includes phase information; another example is frequency information. The sensor 60 is also capable of providing a first output signal 70 related to the information representative of the characteristics of RF power in the RF power coupling element 30. An advanced controller 150 receives the first output signal 70 from the sensor 60. The advanced controller 150 is capable of controlling at least two parameters simultaneously, based on multiple data inputs. In addition, the advanced controller 150 is capable of providing at least two control signals. Control systems are commercially available that can be used for the advanced controller 150. An example of a suitable control system would be microprocessor based control systems such as computers. The advanced controller 150 maintains a constant phase angle between the first output signal 70 and the reference RF signal used by the RF power amplifier 50. The advanced controller 150 maintains the constant phase angle by adjusting the frequency of the reference RF signal used by the RF power amplifier 50. The advanced controller 150 provides the reference RF signal information as a second output signal 90 to the RF power amplifier 50. The RF power amplifier 50 uses the second output signal 90 and electric power input to produce the RF power applied to the RF match 40.

FIG. 3 also illustrates a meter 100. The meter 100 is coupled with the RF power amplifier 50 to enable the meter 100 to derive measurements of the input electric power provided to the RF power amplifier 50. The meter is capable of measuring one or more characteristics of the electric power provided to the RF power amplifier 50. Typically, the electric power provided to the RF amplifier is either DC or slow AC power such as AC frequencies less than about 600 Hz. Examples of the characteristics of the electric power that the meter 100 may be capable of measuring include input power magnitude, input power voltage, and input power current. The meter 100 produces a third control signal 120 containing information from the power measurements by the meter 100. The advanced controller 150 controls the magnitude of a characteristic of the RF power delivered to the load. The power meter 100 provides to the advanced controller 150 the third control signal 120 containing information from the power measurements by the meter 100. The advanced controller 150 also receives set point information 140 for the desired magnitude of the characteristics for the RF power. The advanced controller 150 derives an output signal as a gain signal 130 for controlling magnitude of the RF power delivered to the load. The gain signal 130 is based on the set point information 140 and the third control signal 120. The gain signal 130 from the advanced controller 150 is input to the RF power amplifier 50 for adjusting the gain of the RF power amplifier 50. The advanced controller 150 adjusts the gain of the RF power amplifier 50 to maintain the power input to the RF power amplifier 50 at a value that substantially equals the power specified by the set point information 140. Controlling the input power to the RF power amplifier 50 to the set point information 140 for the advanced controller 150 provides control of the magnitude of the RF power delivered to the RF power processor 20 to a predetermined magnitude.

The embodiment shown in FIG. 3 accomplishes the same results as the embodiment shown in FIG. 2. However, the embodiment shown in FIG. 3 uses only one controller for controlling the RF reference signal and the gain of the RF power.

A preferred characteristic of the RF power in the RF power coupling element 30 for maintaining the predetermined constant phase angle is the phase of the RF current. Specifically, it is preferred to maintain the predetermined constant phase angle between the phase of the reference RF signal used by the RF power amplifier 50 and the phase of the RF current in the RF power coupling element 30. Furthermore, the preferred reference RF signal is RF voltage.

It is preferable in the embodiments of the present invention shown in FIG. 1, FIG. 2, and FIG. 3 to minimize the use of RF cable such as coaxial cable for the connections between the RF power amplifier 50, the RF match 40, and the RF power coupling element 30. It is still more preferable to have no RF cable connections between the RF power amplifier 50, the RF match 40, and the RF power coupling element 30 so that RF power from the RF power amplifier 50 can be applied directly to the RF match 40 and RF power from the RF match 40 can be directly applied to the RF power coupling element 30. Minimizing the use of RF cable also makes it possible for the apparatus to be smaller in size, lighter in weight, and lower in cost.

It is possible for the embodiments of the present invention shown in FIG. 1, FIG. 2, and FIG. 3 to have RF match 40 include variable components for capacitance and inductance. The preferred embodiment for RF match 40 has only fixed components for capacitance and inductance; in other words, it is preferred to use a fixed match for RF match 40. The capacitance and inductance components used in RF match 40, preferably, are selected to produce approximately tuned conditions for RF power delivery to an expected load. Tuning requirements beyond the capability of the fixed match are handled by other parts and systems of the present invention such as the first controller 80 and the sensor 60. The ability to use the fixed match offers the advantages of having no moving parts in the match, simple operation, and immediate response. Overall, the fixed match offers greater reliability.

The embodiments of the present invention shown in FIG. 1, FIG. 2, and FIG. 3 achieve efficient RF power delivery using measurements and control systems that have not been used before. In fact, the measurements and control systems used by the embodiments shown in FIG. 1 and FIG. 2 eliminate the need for some of the components and measurements typically used in prior art RF power delivery systems. As can be seen in FIG. 1, FIG. 2, and FIG. 3, the embodiments of the present invention have neither components nor other circuitry for measuring the magnitude of the RF power delivered to the load. Forward and reflected RF power cannot be measured using the embodiments shown in FIG. 1, FIG. 2, and FIG. 3. Nor is there a need for measuring the RF power magnitude for efficient RF power delivery using the embodiments of the present invention. This is in contrast to the typical prior art wherein the RF power measurements are used as control parameters to achieve efficient RF power delivery by either maximizing the forward RF power, minimizing the reflected RF power, or other behavior of the measured RF power. The prior art typically uses components such as dual directional couplers for measuring forward and reflected RF powers, whereas the present invention has no need for RF power measurement components.

Another alternative used by prior art RF power delivery systems to achieve efficient RF power delivery includes measuring the phase angle between RF current and RF voltage on a line carrying the relatively high power output from an RF power amplifier. The prior art either adjusts the impedance of a variable RF match network or adjust the frequency of the RF power output so that the phase angle between the RF current and the RF voltage is zero on the line connected to the RF power coupling element. The prior art method requires collecting information for two separate phase measurements on the high power RF output (in other words, making two measurements on the large RF signal). As is known to those skilled in the art, making measurements on high power RF signals is difficult and undesirable.

In contrast to the prior art RF power delivery systems, the embodiments of the present invention shown in FIG. 1, FIG.

2, and FIG. 3 are capable of accomplishing efficient RF power delivery by measuring phase information for only one characteristic of the RF power in the RF power coupling element 30. In other words, phase information is measured for only one characteristic of the relatively high RF power (specifically, making one measurement on the large RF signal). The phase information for the RF power in the RF power coupling element is been compared to the reference RF signal (i.e. a small RF signal) used by the RF power amplifier to derive the signal for controlling the RF power delivery. Since the reference RF signal used by the RF amplifier is generated by the controller, there is no need for special equipment to measure the phase information for the reference RF signal.

The sensor 60, which provides the phase information, can be of any type that is capable of deriving phase information representative of one or more of the oscillating characteristics of RF power in the RF power coupling element 30. Examples of the characteristics of RF power for which the sensor 60 can be used are RF current and RF voltage. For deriving the phase of the RF current, the sensor 60 can be a current pickup such as a loop with multiple turns for inductively detecting phase information. In a preferred embodiment, the sensor 60 is a current pickup with a 100 turn loop. Alternatively, the sensor 60 can be a voltage pickup for deriving phase information for the RF voltage.

The RF power coupling element 30 can be of any type suitable for RF power delivery systems. Many types of RF power coupling elements are known in the art. Exemplary types of RF power coupling elements are antennas, coils, cylindrical coils, planar coils, electrodes, rings, parallel plates, screens, and waveguides.

Practicing the present invention does not require the use of the RF power amplifier 50 and the first controller 80 as they are presented in the embodiments shown in FIG. 1, FIG. 2, and FIG. 3. Other types of equipment and configurations can be used for practicing the present invention. For example, the embodiments shown in FIG. 1, FIG. 2, and FIG. 3 indicate that the reference RF signal is provided to the RF power amplifier 50. In an alternative embodiment, the RF amplifier may include a frequency generator such as a voltage controlled oscillator wherein the voltage controlled oscillator generates the reference RF signal based on an input control signal from a controller. For this alternative embodiment, the output for the controller could be a control signal like a DC voltage that determines the frequency for the reference RF signal used by the RF amplifier. Controllers that are capable of providing control signals for voltage controlled oscillators are well known in the art. Persons skilled in the art can provide substitute equipment configurations for additional embodiments of the present invention.

Embodiments of the present invention can be used in a wide variety of RF power delivery applications. The type of application for the embodiments of the present invention determines the required apparatus for the RF power processor 20 (FIG. 1 and FIG. 2). For example, using the present invention embodiments for low-pressure plasma processing such as non-thermal plasma processing requires delivery of RF power to the RF power processor 20 (FIG. 1 and FIG. 2) wherein the RF power processor 20 includes a plasma chamber. The plasma chamber must be capable of containing a gas at suitable pressure for generating the plasma. Plasma chambers of this type are well known in the art. Low-pressure plasma processing chambers, such as vacuum plasma processing chambers, are extensively used in applications such as plasma processes for electronic device fabrication.

Embodiments of the present invention are particularly suited for plasma processing wherein the RF power is coupled to an ionizable gas to produce a plasma for stimulating chemical reactions. Exemplary reactions include reactions for synthesizing chemical products, reactions for decomposing chemical compounds, and reactions for surface treatment. For this type of application, the RF power processor 20 (FIG. 1, FIG. 2, and FIG. 3) includes a plasma chamber with means for receiving and removing the gas, such as gas inlets and gas exits.

Embodiments of the present invention can be used to carry out plasma processing for which the plasma processing includes plasma treatment of a workpiece. Example workpieces include substrates such as semiconductor wafers that are subjected to plasma processes used in the fabrication of electronic devices and substrates subjected to plasma processes for fabrication of optical elements and devices. For applications of this type, the RF power processor 20 (FIG. 1, FIG. 2, and FIG. 3) also includes methods and apparatus for positioning the workpieces during plasma processing. The RF power processor 20 further includes means for receiving and removing ionizable gas suitable for plasma processing.

Alternatively, embodiments of the present invention can be applied to plasmas operating at pressures other than low pressure, like at atmospheric pressure. Plasmas operating at atmospheric pressure, optionally, may be open to the atmosphere. An embodiment of the present invention is to generate a plasma open to the atmosphere without significant confinement of the plasma except the confinement determined by the RF power coupling element. This type of plasma may also be referred to as a plasma torch.

While there have been described and illustrated specific embodiments of the invention, it will be clear that variations in the details of the embodiments specifically illustrated and described may be made without departing from the true spirit and scope of the invention as defined in the appended claims and their legal equivalents.

What is claimed is:

1. An apparatus for RF power delivery to a load, the apparatus comprising:
    an RF power coupling element for delivering RF power to the load;
    an RF match connected with the RF power coupling element for matching the RF power to the load;
    a variable frequency RF power amplifier connected with the RF match, the RF amplifier being capable of providing an output RF power for delivery to the load;
    a sensor for determining phase information for a characteristic of the RF power in the RF power coupling element, the sensor being capable of providing a first output signal related to the phase information for the characteristic of the RF power in the RF power coupling element; and
    a first controller responsive to the first output signal from the sensor, the first controller being arranged to adjust the frequency of a reference RF signal used by the RF power amplifier so as to maintain a constant phase angle between the characteristic of the RF power in the RF power coupling element and the reference RF signal used by the RF power amplifier.

2. The apparatus of claim 1 further comprising:
    a meter for measuring characteristics of power input to the RF power amplifier, the meter being capable of providing a third output signal related to the measured characteristics of power input to the RF power amplifier; and a second controller responsive to the third output signal from the meter and a set point, the second controller being arranged to control the gain of the RF power amplifier so as to allow delivery of a controlled magnitude of a characteristic of the RF power determined by the set point.

3. The apparatus of claim 2 wherein the meter is capable of measuring at least one of magnitude of power, magnitude of current, and magnitude of voltage.

4. The apparatus of claim 2 wherein the measured characteristics of power input to the RF amplifier is the magnitude of power.

5. The apparatus of claim 2 wherein the controlled magnitude of the characteristic of the RF power is at least one of magnitude of RF power, magnitude of RF current, and magnitude of RF voltage.

6. The apparatus of claim 1 wherein the constant phase angle is a predetermined constant phase angle derived from pre-tuning the first controller.

7. The apparatus of claim 1 wherein the RF match is a fixed RF match.

8. The apparatus of claim 1 wherein the sensor is a current pickup for determining phase information for an RF current in the RF power coupling element.

9. The apparatus of claim 1 wherein the sensor is a voltage pickup for determining phase information for an RF voltage in the RF power coupling element.

10. The apparatus of claim 1 wherein the first controller includes a phase locked loop for maintaining the constant phase angle between the reference RF signal and the characteristic of the RF power in the RF power coupling element.

11. The apparatus of claim 1 wherein the RF power coupling element is a coil for inductively coupling RF power to the load to generate a plasma.

12. The apparatus of claim 1 wherein the RF power coupling element is a coil for inductively coupling RF power to the load to produce heat.

13. The apparatus of claim 1 wherein the characteristic of the RF power is at least one of RF current and RF voltage.

14. The apparatus of claim 1 further comprising:
a meter for measuring characteristics of power input to the RF power amplifier, the meter being capable of providing a third output signal related to the measured characteristics of power input to the RF power amplifier;
wherein the first controller is capable of controlling at least two parameters; and
the first controller is responsive to the third output signal from the meter and a set point, the first controller is arranged to control the gain of the RF power amplifier so as to allow delivery of a controlled magnitude of a characteristic of the RF power determined by the set point.

15. The apparatus of claim 1 wherein:
the RF match is a fixed RF match;
the sensor is a current pickup and the phase information for the characteristic of the RF power is RF current in the RF power coupling element;
the constant phase angle is a predetermined constant phase angle derived from pre-tuning the first controller;
the first controller is a phase locked loop for maintaining the predetermined constant phase angle between the reference RF signal and the RF current in the RF power coupling element; and
the RF power coupling element is a coil for inductively coupling RF power to the load to generate a plasma.

16. In combination,
an RF power processor for receiving RF power;
an RF power coupling element for delivering RF power to the RF power processor;
an RF match connected with the RF power coupling element;
a variable frequency RF power amplifier connected with the RF match, the RF power amplifier being capable of providing an output RF power for delivery to the RF power processor;
a sensor for determining phase information for a characteristic of the RF power in the RF power coupling element, the sensor being capable of providing a first output signal related to the phase information for the characteristic of the RF power in the RF power coupling element;
and a first controller responsive to the first output signal from the sensor, the first controller being arranged to adjust the frequency of a reference RF signal used by the RF power amplifier so as to maintain a constant phase angle between the characteristic of the RF power in the RF power coupling element and the reference RF signal used by the RF power amplifier.

17. The combination of claim 16 further comprising:
a meter for measuring characteristics of power input to the RF power amplifier, the meter being capable of providing a third output signal related to the measured characteristics of power input to the RF power amplifier;
and a second controller responsive to the third output signal from the meter and a set point, the second controller being arranged to control the gain of the RF power amplifier so as to allow delivery of a controlled magnitude of RF power determined by the set point.

18. The combination of claim 17 wherein the RF power processor includes a vacuum plasma processing chamber capable of sustaining a non-thermal plasma for abating refractory compounds selected from the group consisting of perfluorocompounds, carbon fluorides, carbon tetrafluoride, nitrogen triflouride, and sulfur hexafluoride.

19. The combination of claim 16 wherein the RF power processor includes a plasma chamber capable of receiving a gas for generating a plasma.

20. The combination of claim 16 wherein the RF power processor is capable of receiving a semiconductor wafer for plasma processing.

21. The combination of claim 16 wherein the RF power processor includes a vacuum plasma processing chamber capable of sustaining a non-thermal plasma for semiconductor device fabrication processes.

22. The combination of claim 16 wherein the RF power processor includes a vacuum plasma processing chamber capable of sustaining a non-thermal plasma for semiconductor device fabrication processes selected from the group consisting of etching, deposition, surface cleaning, doping, oxidation, drying, photoresist stripping, reaction chamber cleaning, and annealing.

23. The combination of claim 17 wherein the RF power processor includes a vacuum plasma processing chamber capable of sustaining a non-thermal plasma for stimulating chemical reactions.

24. The combination of claim 16 wherein the RF power processor is capable of receiving the RF power to produce heat for an RF power induction heating process.

25. The combination of claim 16 wherein the RF power processor includes a vacuum plasma processing chamber for generating a non-thermal plasma.

26. A method of delivering RF power to a load, the method being performed with a variable frequency RF power amplifier and an RF power coupling element connected with the RF power amplifier to receive RF power, the method comprising maintaining a constant phase angle between the phase of a reference signal used by the variable frequency RF power amplifier and a phase of a characteristic of the RF power in the RF power coupling element so as to effect efficient RF power delivery to the load.

27. The method of claim 26 further comprising the step of adjusting the gain of the RF power amplifier in response to a set point and measured characteristics of the electric power input to the RF power amplifier so as to maintain the electric power input at a level specified by the set point and allowing the amount of RF power output from the RF power amplifier to maintain a constant delivery of a magnitude of a characteristic of the RF power to the load as determined by the set point.

28. The method of claim 27 wherein the measured characteristics of the electric power input to the RF power amplifier includes at least one of magnitude of power, magnitude of current, and magnitude of voltage.

29. The method of claim 27 wherein the measured characteristics of power input to the RF amplifier includes magnitude of power.

30. The method of claim 27 wherein constant magnitude of RF power delivery to the load is at least one of magnitude of RF power, magnitude of the RF current, and magnitude of the RF voltage.

31. The method of claim 26 wherein the characteristic of the RF power in the RF power coupling element is an RF current.

32. The method of claim 26 wherein the characteristic of the RF power in the RF power coupling element is an RF voltage.

33. The method of claim 26 wherein the constant phase angle is a predetermined constant phase angle derived from pre-tuning.

34. The method of claim 26 wherein the load includes ionizable gases and the method further comprising the step of generating a plasma.

35. The method of claim 26 further comprising the step of heating the load by RF power induction.

* * * * *